US007736167B2

(12) United States Patent
Liao

(10) Patent No.: US 7,736,167 B2
(45) Date of Patent: Jun. 15, 2010

(54) ELECTRICAL CONNECTOR HAVING A PAIR OF LOAD LEVERS

(75) Inventor: Chi-Nan Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 33 days.

(21) Appl. No.: 12/322,536

(22) Filed: Feb. 3, 2009

(65) Prior Publication Data

US 2009/0197454 A1 Aug. 6, 2009

(30) Foreign Application Priority Data

Feb. 4, 2008 (TW) .............................. 97202311 U

(51) Int. Cl.
*H01R 13/62* (2006.01)
(52) U.S. Cl. ...................................... 439/331
(58) Field of Classification Search ............... 439/71, 439/73, 331, 326, 342
See application file for complete search history.

(56) References Cited

U.S. PATENT DOCUMENTS

| 6,916,195 | B2 * | 7/2005 | Byquist | 439/342 |
| 6,969,267 | B2 * | 11/2005 | Byquist | 439/73 |
| 6,991,474 | B1 * | 1/2006 | Ju | 439/73 |
| 7,137,840 | B1 * | 11/2006 | Ju | 439/330 |
| 7,252,517 | B2 * | 8/2007 | Ju | 439/73 |
| 7,258,563 | B2 * | 8/2007 | Ju | 439/331 |
| 7,371,100 | B1 * | 5/2008 | Polnyi | 439/331 |

* cited by examiner

*Primary Examiner*—Briggitte R Hammond
(74) *Attorney, Agent, or Firm*—Andrew C. Cheng; Wei TE Chung; Ming Chieh Chang

(57) ABSTRACT

An electrical connector mounted to a printed circuit board for receiving an IC package is provided that includes an insulative housing (1) mounted to the printed circuit board, a plurality of contacts (2) received in the insulative housing, a positioning member (3) mounted to the circuit board and located around the insulative housing (1), and a load plate (4) covering above the insulative housing (1). A first load lever (5) is pivotally connected to one side of the positioning member (3) and locks one end of the load plate (4), and a second load lever (6) is pivotally connected at an opposite end of the positioning member (3) and locking an opposite end of the load plate (4).

14 Claims, 5 Drawing Sheets

ELECTRICAL CONNECTOR HAVING A PAIR OF LOAD LEVERS

1. FIELD OF THE INVENTION

The present invention relates to an electrical connector, and more particularly to an electrical connector which employs a pair of load levers to fasten an load plate.

2. DESCRIPTION OF PRIOR ART

Electrical connectors are widely used in the electronic transmitting field to interconnect two separate electronic components, i.e. an IC package and a motherboard, so as to establish electrical connection therebetween. The electrical connector basically includes an insulative housing and a plurality of electrical contacts received in the housing, where one kind of land grid array (LGA) type contacts are commonly used in recent years to interconnect the electronic components, especially to interconnect an LGA type IC package with an LGA type connector. Commonly, when the LGA type IC package is mounted onto an insulative housing of the LGA type connector, electronic pads of the IC package all resist the LGA type contacts in the housing of the LGA type connector thereby establishing the electrical connection.

U.S. Pat. No. 6,957,973 issued to McHugh on Oct. 25, 2005 discloses a LGA connector, which includes an insulative housing with a number of contacts received therein, a positioning member secured around the housing, a load lever pivotally assembled to one end of the positioning member and a load plate connected to the load lever. The load plate rotates along with the load lever to a horizontal position, and then moves horizontally due to actuation by an actuating portion of the load lever, so that a tongue portion on a tip end of the load lever moves into a slot on the positioning member and thereby fastens the load plate to a closed position.

However, the fastening means in McHugh needs a high requirement to the dimension to the product, especially to the load plate and the positioning member. If the there is a gap existing between the slot of the positioning member and the tongue portion of the load plate, it may cause the load plate not to be stable and therefore brings disadvantage to the connection between the IC package and the electrical connector.

U.S. Pat. No. 6,991,474 issued to Ted Ju on Jan. 31, 2006 discloses another LGA connector, which includes an insulative housing with a number of contacts received therein, and a pair of load levers pivotally assembled to opposite ends of the housing. When an IC package is put on the housing to be connected with the contacts, the two load levers simultaneously rotate to closed positions to press opposite edges of the IC package and have the IC package stably mounted on the housing.

In U.S. Pat. No. 6,991,474, however, the IC package is mounted on the housing and retained only by the load levers. The load levers have simple structure and fail to provide the IC package with sufficient and even retaining force. Therefore the IC package is also unstable, and the reliability of the electrical connection between the IC package and the connector is not ensured.

Thus, there is a need to provide a new electrical connector that overcomes the above-mentioned problems.

SUMMARY OF THE INVENTION

It is therefore the object of the present invention to provide an electrical connector capable of providing reliable connection between an IC package and the electrical connector.

In accordance with the present invention, an electrical connector mounted to a printed circuit board for receiving an IC package is provided that includes an insulative housing mounted to the printed circuit board, a plurality of contacts received in the insulative housing, a positioning member mounted to the circuit board and located around the insulative housing, and a load plate covering above the insulative housing. A first load lever is pivotally connected to one side of the positioning member and locks one end of the load plate, and a second load lever is pivotally connected to an opposite end of the positioning member and locks an opposite end of the load plate.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
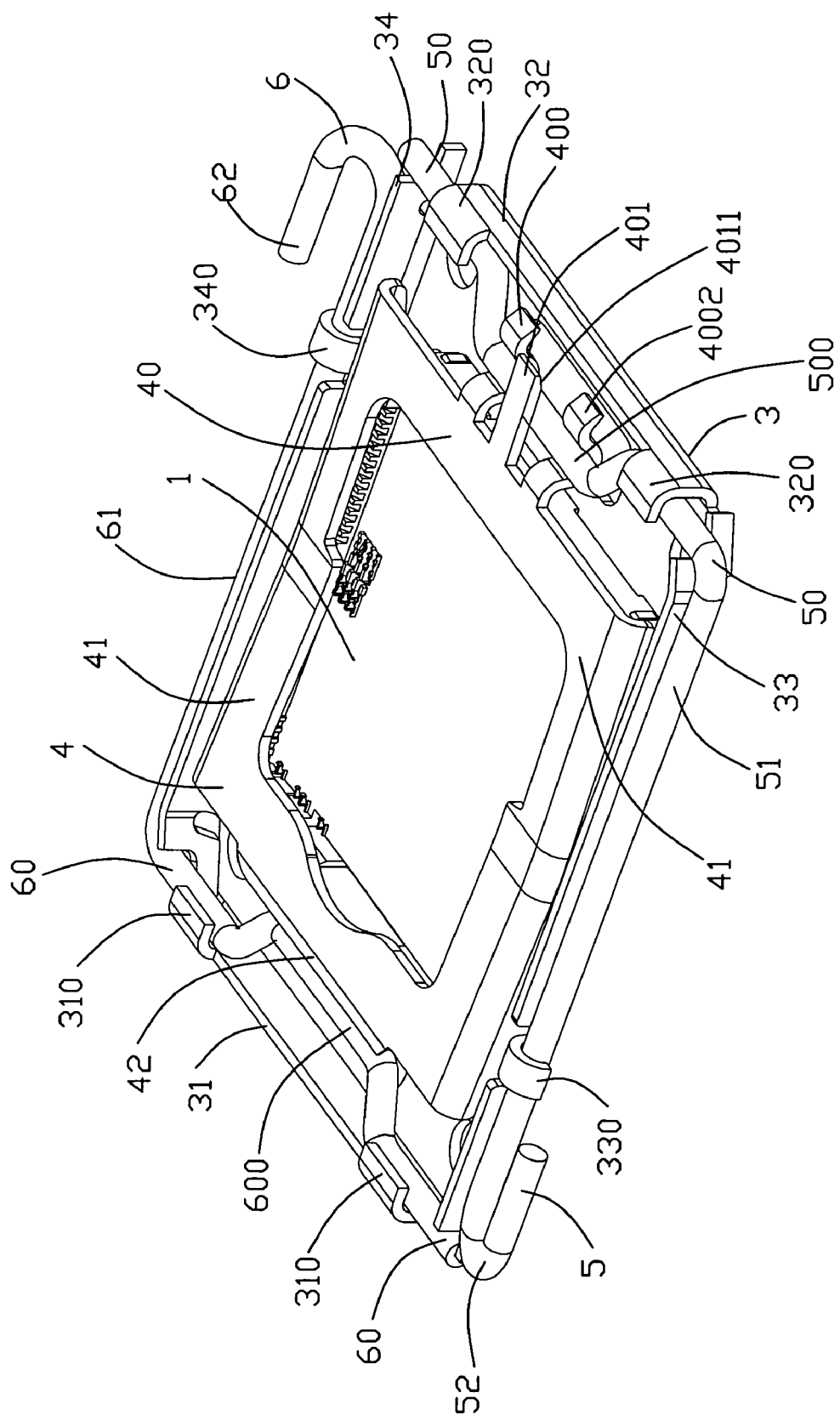
FIG. 1 is an assembled, perspective view of an electrical connector in accordance with a preferred embodiment of the present invention, in which a load plate is in a closed position.
Figure 2:
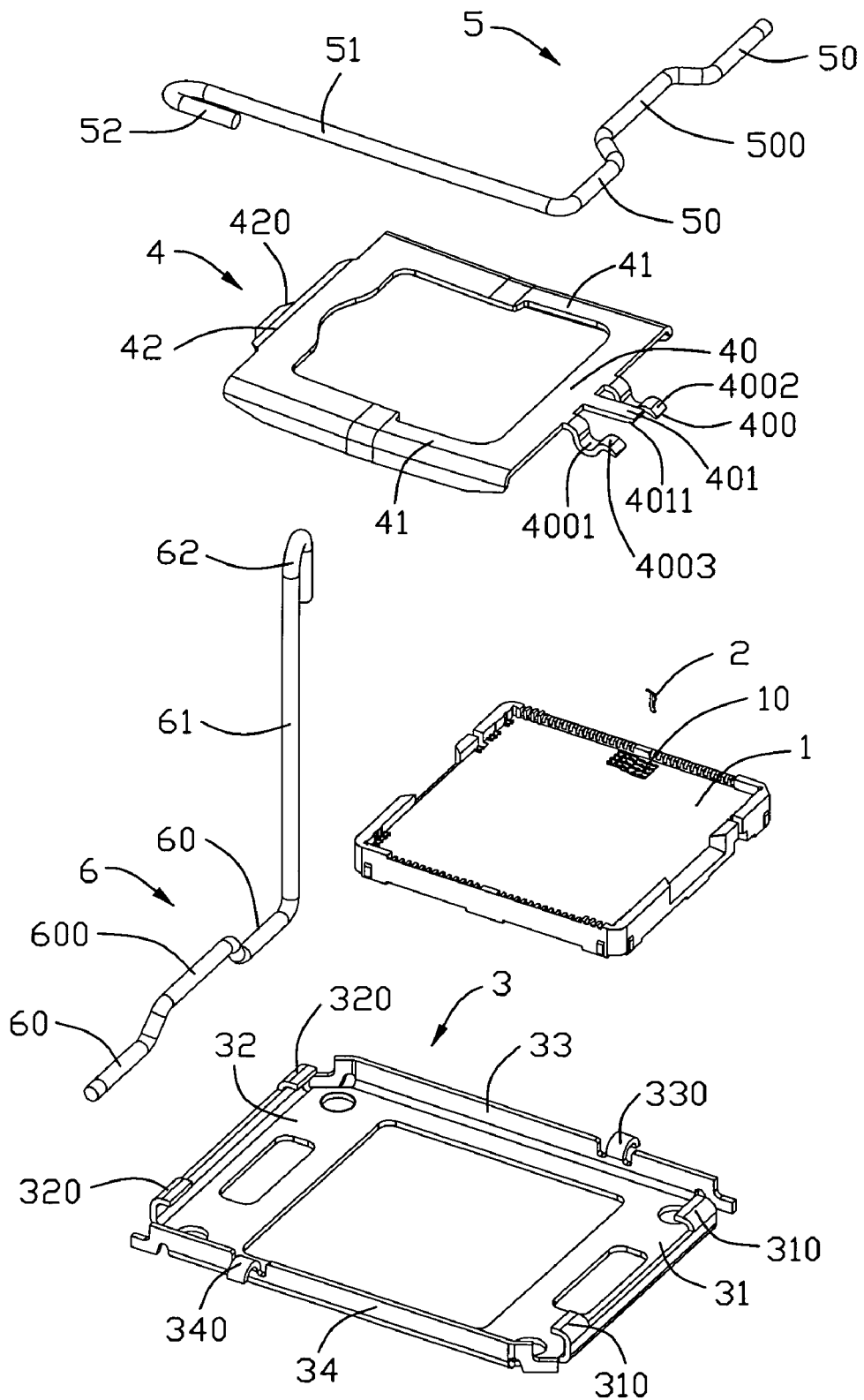
FIG. 2 is an exploded, perspective view of the electrical connector in accordance with the preferred embodiment.
Figure 3:
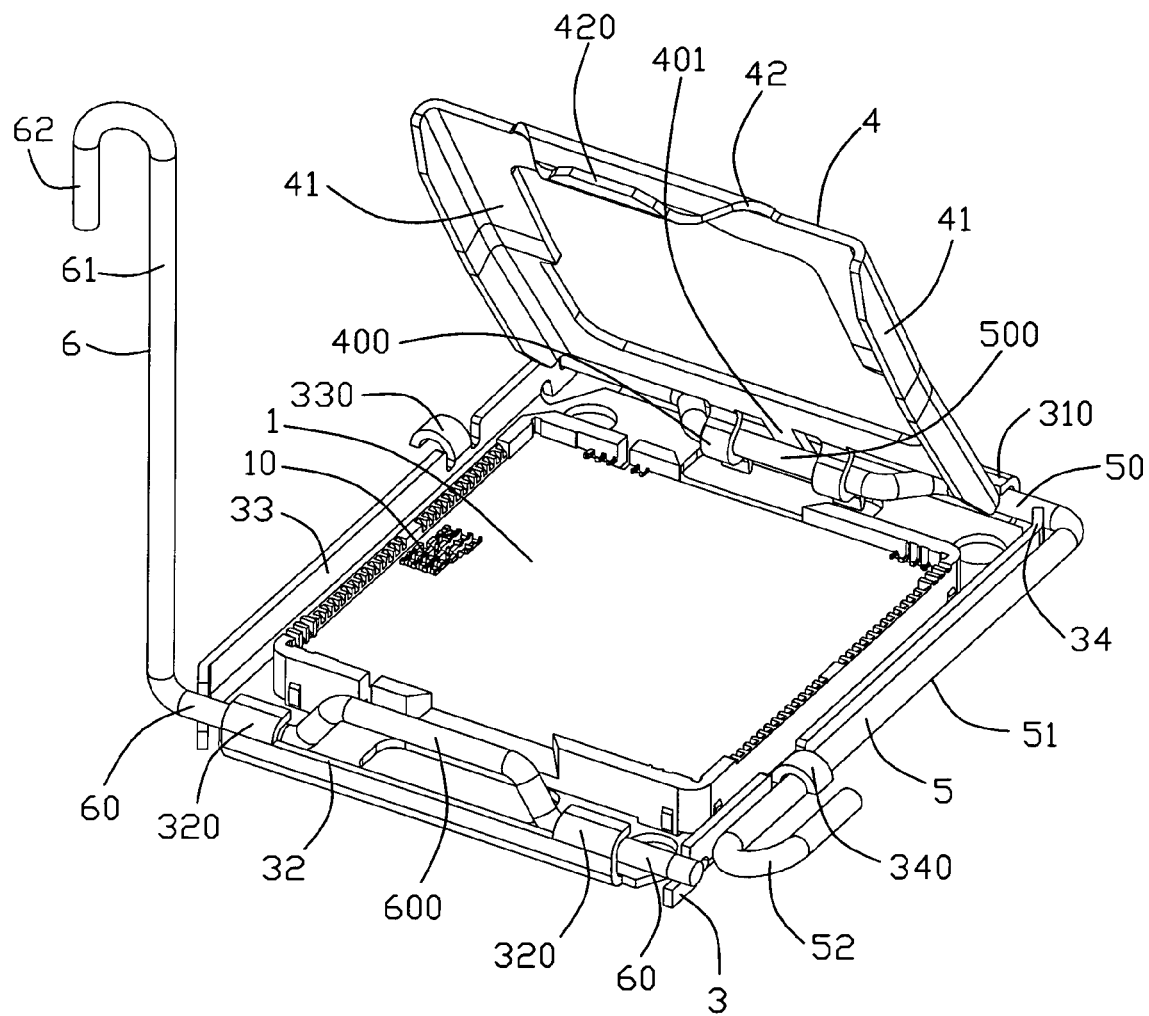
FIG. 3 is an assembled, perspective view of the electrical connector in accordance with the preferred embodiment of the present invention, in which the load plate is in an open position.

Referring to FIGS. 1-3, an electrical connector (not labeled) in accordance with a preferred embodiment of the present invention is generally mounted to a printed circuit board (not shown) to receive an IC package (not shown). The electrical connector includes an insulative housing 1 with a plurality of contacts 2 received therein, a positioning member 3 positioned around the insulative housing 1, and a load plate 4 covering above the insulative housing 1. A first load lever 5 and a second load lever 6 are respectively located at opposite ends of the insulative housing 1, and pivotally connected to the opposite ends of the positioning member 3 to fasten the load plate 4.

Referring to FIGS. 2-3, the insulative 1 housing is molded to a rectangular shape, and the positioning member 3 is formed with a frame structure and encloses the insulative housing 1. Both the insulative housing 1 and the positioning member 3 are mounted to the printed circuit board. The insulative housing 1 has a plurality of passageways 10 therein to receive the contacts 2. The positioning member 3 is made from a metal plate and includes opposite first end 31 and second end 32, and opposite first lateral side 33 and second lateral side 34. A pair of spaced first hooks 310 extend upward from the first end 31, and a pair of spaced second hooks 320 extend upward from the second end 32. Further, a pair of clasps 330, 340 are respectively formed on the first lateral side 33 and the second lateral side 34.

The load plate 4 has a frame structure and includes a connecting portion 40 at one end thereof, an engaging portion 42 at an opposite end, and two lateral pressing portions 41. Particularly referring to FIGS. 4 and 5, the connecting portion 40 includes a pair of parallel lower guiding tabs 400 extending rearward and an upper guiding tab 401 extending rearward between the lower guiding tabs 400. The lower guiding tabs 400 are formed with S-like shape and the upper guiding tab 401 is formed with a straight shape. A receiving channel 4001 is defined between the lower guiding tabs 400 and the upper guiding tab 401 to receive the first load lever 5. The upper guiding tab 401 and the lower guiding tabs 400 respectively have guiding surfaces 4011, 4002 at free ends thereof where an opening (not labeled) is defined for insertion of the first load lever 5. Further, a gap 4003 is defined between the upper guiding tab and the lower guiding tabs, and between the opening and the receiving channel 4001. The gap 4003 has a smaller dimension D1 than the diameter D2 of the first load lever 5 when taken from a side view. The engaging portion 42 has a tongue portion 420 for engaging with the second load lever 6.

Figure 4:
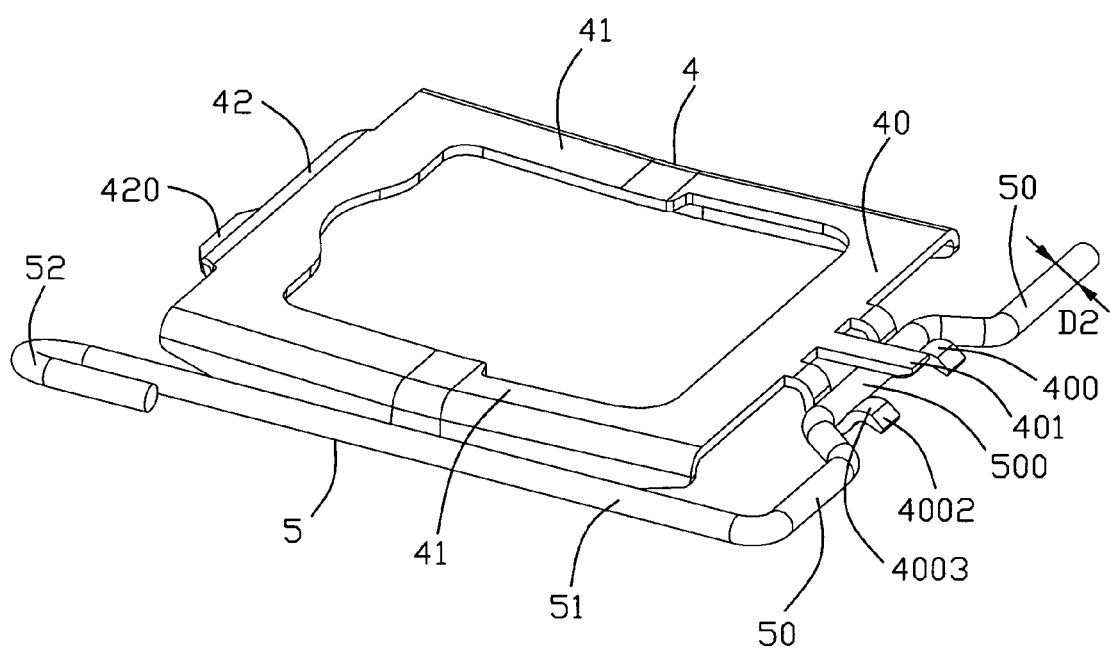
FIG. 4 is a perspective view of the load plate with a first load lever assembled thereto in accordance with the preferred embodiment.
Figure 5:
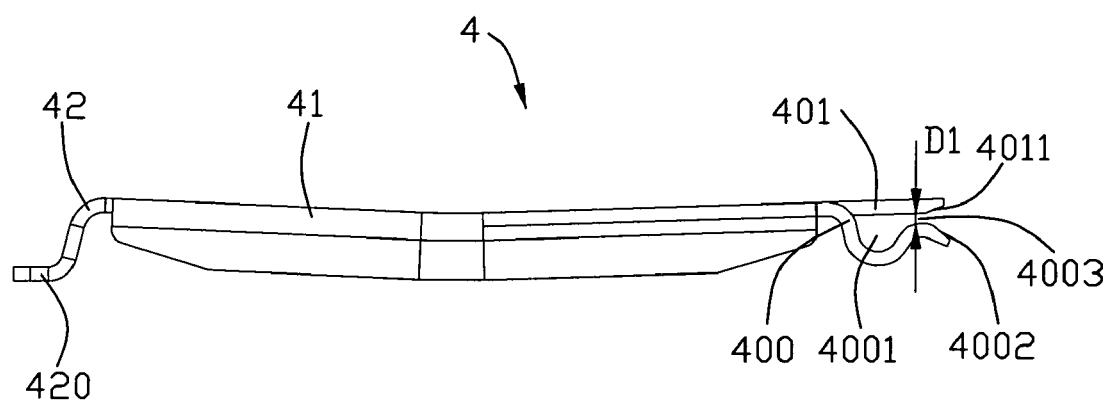
FIG. 5 is a side view of the load plate in accordance with the preferred embodiment.

Referring to FIG. 2 to FIG. 4, the first load lever 5 and the second load lever 6 have similar configuration and respectively engaging with the first hooks 310 and the second hooks 320 so as to connect to opposite first end 31 and second end 32 of the positioning member 3. The first load lever 5 includes a first locking arm 50 and a first operating arm 51 perpendicular to the first locking arm 50. Similarly, the second load lever 6 includes a second locking arm 60 and a second operating arm 61 perpendicular to the first locking arm 60. A first locking portion 500 is bended from the first locking arm 50 to connect the connecting portion 40 of the load plate 4. The load plate 4 is able to rotate along with the first load lever 5 to a closed position, and then have its one end locked by the first locking arm 50. The tongue portion 420 at the opposite end of the load plate 4 is locked by a second locking portion 600 which is bended from the second locking arm 60. The first operating arm 51 and the second operating arm 61 are respectively located at opposite lateral sides of the insulative housing 1 and respectively locked by the clasps 330, 340 on the positioning member 3. In addition, each of the first load lever 5 and the second load lever 6 respectively have operating portions 52, 62 formed at the ends of the first locking arm 51 and the second locking arm 61.

When the first load lever 5 is assembled with the load plate 4, the first locking portion 500 is pushed into the receiving channel 4001 via the gap 4003. The lower guiding tabs 400 and the upper guiding tab 401 deform when abutting against the first locking portion 500. After the IC package is put on insulative housing 1, rotate the first load lever 5 and have the load plate 4 move along with the first load lever 5 toward the IC package to a substantial horizontal position, and then further rotate the first load lever 5 to actuate the load plate 4 to move horizontally with a slight distance. At last, the first operating arm 51 is locked by the clasp 340. Rotate the second load lever 6 and let the second locking portion 600 press the tongue portion 420 at the other end of the load plate 4 until the second operating arm 61 is locked by the clasp 330. Thus, the two opposite ends of the load plate 4 are fastened respectively by the first load lever 5 and the second load lever 6.

It can be clearly seen that the load plate 4 is locked by a pair of load levers 5, 6 from opposite ends thereof so as to achieve fine locking effect, and a stable connection between the electrical connector and the IC package is thereby ensured.

It is noted that in the most conventional connectors, e.g., U.S. Pat. No. 7,083,430, the load plate is essentially pivotally mounted to one end of the positioning member and pivotal with thereof a fixed type pivot axis and the free distal end pressed by the single load lever which is pivotally mounted to the other end of the positioning member with another fixed type pivot axis thereof. It is also noted that in the aforementioned U.S. Pat. No. 6,957,973, the load plate is pivotally fixed to the rotatable lever having a moveable pivotal axis whose moving path is an arc. Even though the connector as disclosed in U.S. Pat. No. 6,957,973 has the aforementioned shortcoming of requirement of high precision, the moveable pivotal axis thereof may prevent the possible interference among the rotating load plate, the electronic package and the housing which may occur around such fixed pivot axis/end due to the limited space thereabouts. It is because the moveable/floating pivot axis in U.S. Pat. No. 6,957,973 may forgive such interference. Thus, the invention essentially owns the advantage of U.S. Pat. No. 6,957,973, i.e., the floating pivot axis of the rotating load plate for avoiding interference, while preventing the disadvantage thereof, i.e, the high precision requirement between the slot of the positioning member and the tongue of the load plate existing in U.S. Pat. No. 6,957,973, by means of providing another/additional load lever pressing downwardly against the free distal end of the load plate. On the other hand, it is also noted that even though the aforementioned U.S. Pat. No. 6,991,414 discloses two opposite load levers, it lacks the load plate so that the electronic package endures the imposed forces at two opposite ends of the electronic package rather than the middle area of the electronic package that is preferably used in the industry. In conclusion, the instant invention discloses a novel structure and owns thereof the several advantages which are not achieved by the aforementioned different type prior arts.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector mounted to a printed circuit board for receiving an IC package comprising:
    an insulative housing mounted to the printed circuit board;
    a plurality of contacts received in the insulative housing;
    a positioning member mounted to the circuit board and located around the insulative housing;
    a load plate covering above the insulative housing;
    a first load lever pivotally connected to one side of the positioning member and locking one end of the load plate; and
    a second load lever pivotally connected to an opposite end of the positioning member and locking an opposite end of the load plate;
    wherein the load plate has an attaching arrangement by which the load plate is attached to the first load lever both in a closed position and an opened position, and the second lever is only engaged with the load plate when the load plate is in the closed position.

2. The electrical connector as claimed in claim 1, wherein the first load lever includes a first locking arm and a first operating arm perpendicular to the first locking arm, and the second load lever includes a second locking arm and a second operating arm perpendicular to the second locking arm.

3. The electrical connector as claimed in claim 2, wherein the first operating arm and the second operating arm are respectively located at opposite lateral sides of the positioning member.

4. The electrical connector as claimed in claim 1, wherein said one end of the load plate is formed with a connecting portion connected to and actuated by the first locking arm.

5. The electrical connector as claimed in claim 4, wherein the connecting portion includes at least one lower guiding tab and at least one upper guiding tab, which together define a receiving channel therebetween to connect the first load lever.

6. The electrical connector as claimed in claim 5, wherein at least one of the upper guiding tab and the lower guiding tab has a guiding surface at a free end thereof where an opening is defined for insertion of the first load lever.

7. The electrical connector as claimed in claim 6, wherein at least one of the upper guiding tab and the lower guiding tab is formed with S-like shape, and a gap is defined between the upper guiding tab and the lower guiding tab to have a smaller dimension than the diameter of the first load lever when taken from a side view.

8. The electrical connector as claimed in claim 7, wherein two said lower guiding tabs are provided, respectively located at opposite sides of the upper guiding tab.

9. An electrical connector mounted to a printed circuit board for receiving an IC package comprising:
- an insulative housing mounted to the printed circuit board with a plurality of contacts received therein;
- a first load lever secured at one end of the insulative housing having a first locking arm and a first operating arm;
- a second load lever secured at an opposite end of the insulative housing and having a second locking arm and a second operating arm; and
- a load plate having a connection portion connected to and actuated by the first locking arm and an engaging portion pressed by the second locking arm.

10. The electrical connector as claimed in claim 9, further comprising a positioning member having two ends respectively connected to the first load lever and the second load lever.

11. The electrical connector as claimed in claim 10, wherein the connecting portion includes at least one lower guiding tab and at least one upper guiding tab, which together define a receiving channel therebetween to connect the first load lever.

12. The electrical connector as claimed in claim 11, wherein at least one of the upper guiding tab and the lower guiding tab has a guiding surface at a free end thereof where an opening is defined for insertion of the first load lever.

13. The electrical connector as claimed in claim 12, wherein at least one of the upper guiding tab and the lower guiding tab is formed with S-like shape, and a gap is defined between the upper guiding tab and the lower guiding tab to have a smaller dimension than the diameter of the first load lever when taken from a side view.

14. The electrical connector as claimed in claim 9, wherein two said lower guiding tabs are provided, respectively located at opposite sides of the upper guiding tab.

* * * * *